United States Patent
Lin et al.

(12)

(10) Patent No.: US 10,514,597 B2
(45) Date of Patent: Dec. 24, 2019

(54) LITHOGRAPHY MASK WITH BOTH TRANSMISSION-TYPE AND REFLECTIVE-TYPE OVERLAY MARKS AND METHOD OF FABRICATING THE SAME

(71) Applicant: Taiwan Semiconductor Manufacturing Co., Ltd., Hsinchu (TW)

(72) Inventors: Yun-Yue Lin, Hsinchu (TW);
Hsin-Chang Lee, Hsinchu (TW);
Chia-Jen Chen, Hsinchu (TW);
Chih-Cheng Lin, Kaohsiung (TW);
Anthony Yen, Hsinchu (TW);
Chin-Hsiang Lin, Hsin-chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 159 days.

(21) Appl. No.: 15/670,183

(22) Filed: Aug. 7, 2017

(65) Prior Publication Data

US 2018/0149959 A1 May 31, 2018

Related U.S. Application Data

(60) Provisional application No. 62/427,889, filed on Nov. 30, 2016.

(51) Int. Cl.
| | |
|---|---|
| *G03F 1/24* | (2012.01) |
| *G03F 1/26* | (2012.01) |
| *G03F 1/42* | (2012.01) |
| *G03F 1/48* | (2012.01) |
| *G03F 1/54* | (2012.01) |
| *G03F 1/50* | (2012.01) |

(52) U.S. Cl.
CPC .............. *G03F 1/24* (2013.01); *G03F 1/26* (2013.01); *G03F 1/42* (2013.01); *G03F 1/48* (2013.01); *G03F 1/50* (2013.01); *G03F 1/54* (2013.01)

(58) Field of Classification Search
CPC ..... G03F 1/24; G03F 1/26; G03F 1/42; G03F 1/48; G03F 1/50; G03F 1/54
USPC .......................................................... 430/5
See application file for complete search history.

(56) References Cited

U.S. PATENT DOCUMENTS

| | | |
|---|---|---|
| 8,187,774 B2 | 5/2012 | Jeong |
| 8,628,897 B1 | 1/2014 | Lu et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,722,286 B2 | 5/2014 | Yu et al. |
| 8,753,788 B1 | 6/2014 | Yu et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,785,084 B2 | 7/2014 | Lu et al. |
| 8,828,625 B2 | 9/2014 | Lu et al. |
| 8,841,047 B2 | 9/2014 | Yu et al. |
| 8,877,409 B2 | 11/2014 | Hsu et al. |
| 2013/0202992 A1 | 8/2013 | Chen et al. |
| 2015/0286146 A1 | 10/2015 | Chang et al. |
| 2015/0309405 A1 | 10/2015 | Shih et al. |
| 2015/0311075 A1 | 10/2015 | Huang et al. |

*Primary Examiner* — Christopher G Young
(74) *Attorney, Agent, or Firm* — Haynes and Boone, LLP

(57) ABSTRACT

A lithography mask includes a substrate that contains a low thermal expansion material (LTEM). A reflective structure is disposed over a first side of the substrate. An absorber layer is disposed over the reflective structure. The absorber layer contains one or more first overlay marks. A conductive layer is disposed over a second side of the substrate, the second side being opposite the first side. The conductive layer contains portions of one or more second overlay marks. In some embodiments, the lithography mask includes an EUV lithography mask.

20 Claims, 15 Drawing Sheets

LITHOGRAPHY MASK WITH BOTH TRANSMISSION-TYPE AND REFLECTIVE-TYPE OVERLAY MARKS AND METHOD OF FABRICATING THE SAME

PRIORITY DATA

This application claims benefit of U.S. Provisional Application No. 62/427,889, filed Nov. 30, 2016, herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the semiconductor device sizes continue to shrink, for example below 20 nanometer (nm) nodes, traditional lithography technologies have optical restrictions, which leads to resolution issues and may not achieve the desired lithography performance. In comparison, extreme ultraviolet (EUV) lithography can achieve much smaller device sizes. However, existing semiconductor fabrication may still have shortcomings. For example, existing semiconductor fabrication lithography masks are not capable of using alignment marks that work both for conventional lithography processes and EUV lithography.

Therefore, while existing lithography systems and methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
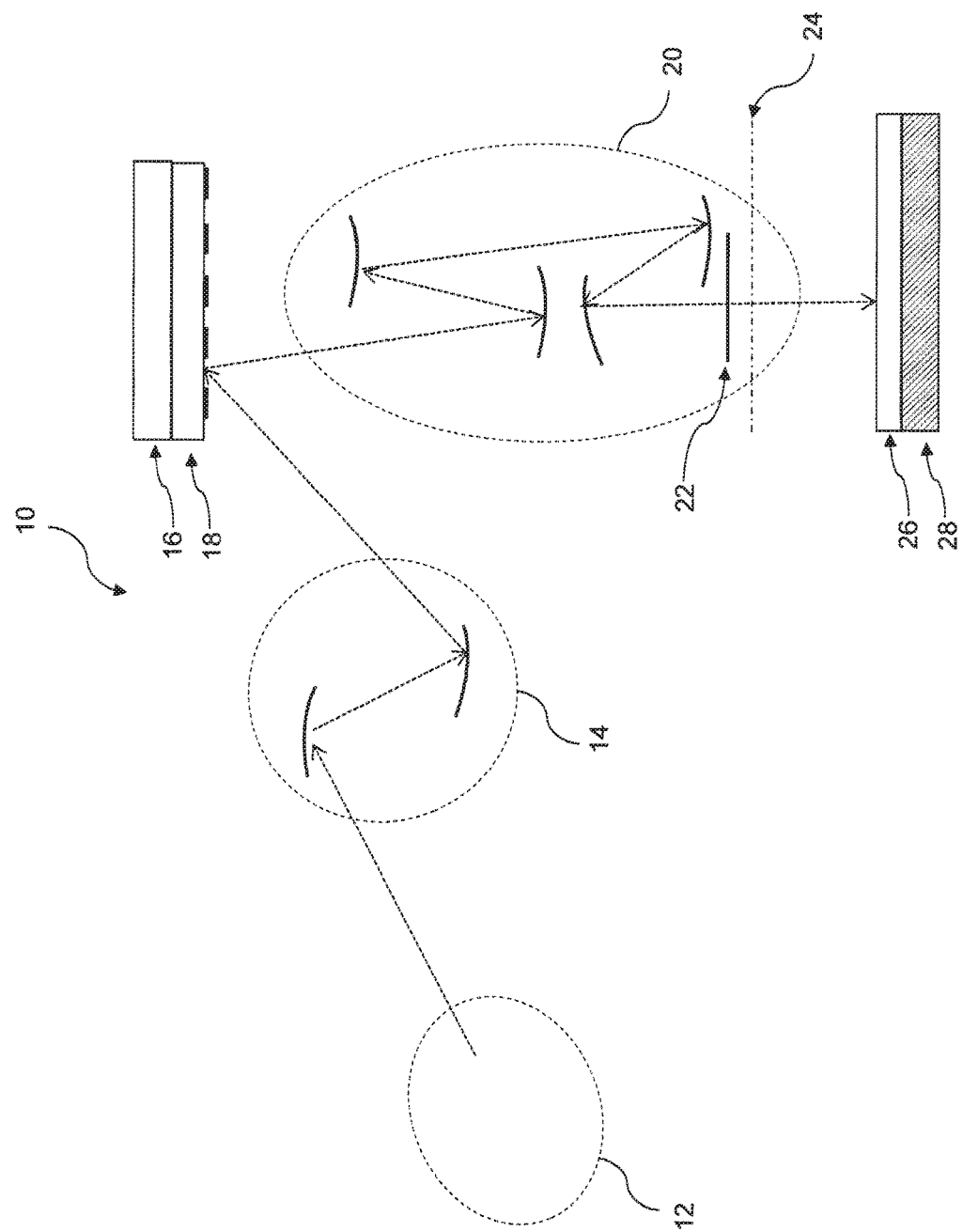
FIG. 1 is a schematic view of a lithography system constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be, limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Extreme ultraviolet (EUV) lithography has become widely used due to its ability to achieve small semiconductor device sizes. However, conventional systems and methods of performing EUV lithography may have shortcomings. For example, conventional EUV systems employ a lithography mask configured to perform EUV lithography. To ensure accurate alignment (also referred to as overlay) between the various layers in a fabricated semiconductor device, overlay marks (or alignment marks) are used to measure the alignment between the layers. Traditionally, non-EUV lithography such as optical lithography (e.g., using a 193 nm light source) has used transmission type overlay marks for its lithography mask, whereas EUV lithography has used reflective type overlay marks.

However, the fabrication of so semiconductor devices may involve both optical lithography and EUV lithography. For example, some layers of a wafer may need to be formed using optical lithography (using an optical lithography mask), while other layers of the wafer may need to be formed using EUV lithography (using an EUV lithography mask). The different types of overlay marks used for optical lithography and EUV lithography make lead to additional difficulties in achieving good alignment or overlay, which may degrade semiconductor performance.

To overcome the problems discussed above, the present disclosure provides a lithography mask (and a method of fabricating the same) that includes both the transmission type overlay marks as well as the reflective type overlay marks. The various aspects of the present disclosure will be discussed below in greater detail with reference to FIGS. 1-14. First, a EUV lithography system will be discussed below with reference to FIGS. 1-2. Next, the details of a cleaning system and method according to embodiments of the present disclosure are discussed with reference to FIGS. 3-14.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence σ being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence σ of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0 \times 10^{-6}/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module projection optics box (POB) 20 for imaging the pattern of the mask 18 on to a semiconductor substrate 26 secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 is coated with the resist layer sensitive to the radiation beam, such as EUV light in the present embodiment. Various components including those described above are integrated together and are operable to perform lithography exposing processes. The lithography system 10 may further include other modules or be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
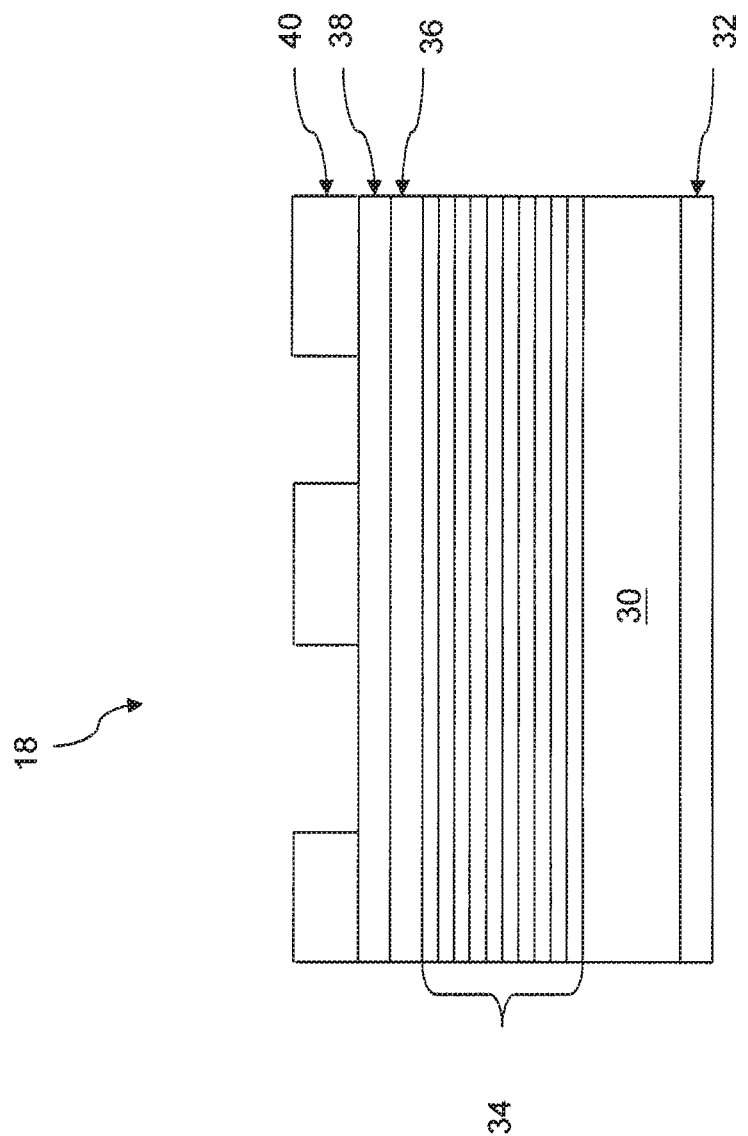
FIG. 2 is a sectional view of a EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer (ML) structure 34 disposed over the LTEM substrate 30. The ML structure 34 may be selected such that it provides a high reflectivity to a selected radiation type/wavelength. The ML structure 34 includes a plurality of film pairs, such as Mo/Si film pairs (e.g., a layer of molybdenum above or below a layer of silicon in each film pair). Alternatively, the ML structure 34 may include Mo/Be film pairs, or any materials with refractive index difference being highly reflective at EUV wavelengths.

Still referring to FIG. 2, the EUV mask 18 also includes a capping layer 36 disposed over the ML structure 34 to prevent oxidation of the ML. In one embodiment, the capping layer 36 includes silicon h a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TAN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 3:
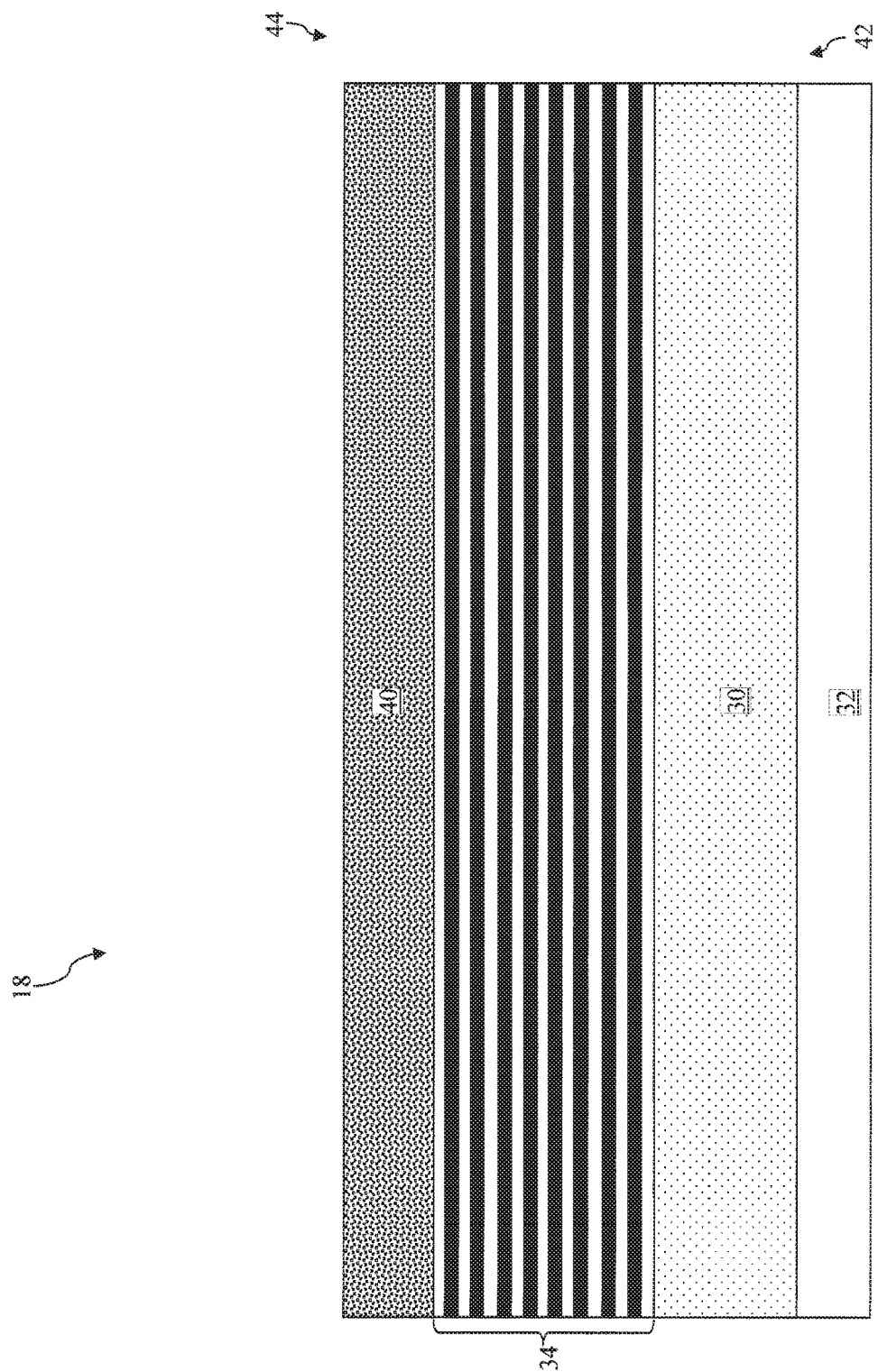
FIGS. 3-12 illustrate cross-sectional views of a lithography mask undergoing different stages of processing according to embodiments of the present disclosure.

FIGS. 3-11 are diagrammatic fragmentary cross-sectional side views of a lithography mask at various stages of fabrication according to embodiments of the present disclosure. In the illustrated embodiment, the lithography mask may be an EUV mask such as the EUV mask 18 discussed above with reference to FIGS. 1-2. For example, as shown in FIG. 3, the EUV mask 18 includes the LTEM substrate 30. The conductive layer 32 (e.g., containing a CrN material or a tantalum-containing material) is formed on the LTEM substrate 30 from a side 42. The reflective ML structure 34 is formed on the LTEM substrate 30 from a side 44, where the side 44 is opposite the side 42. The absorber layer 40 is formed over the reflective ML structure 34 (over the side 44). As discussed below, the EUV mask 18 will be patterned from the side 44 to forth reflective-type overlay marks, and it will be patterned from the side 42 to form transmission-type overlay marks. It is understood that the EUV mask 18 may also include the capping layer 36 and the buffer layer 38 discussed above with reference to FIG. 2, but the capping layer 36 and the buffer layer 38 are not specifically illustrated herein for reasons of simplicity.

Figure 4:
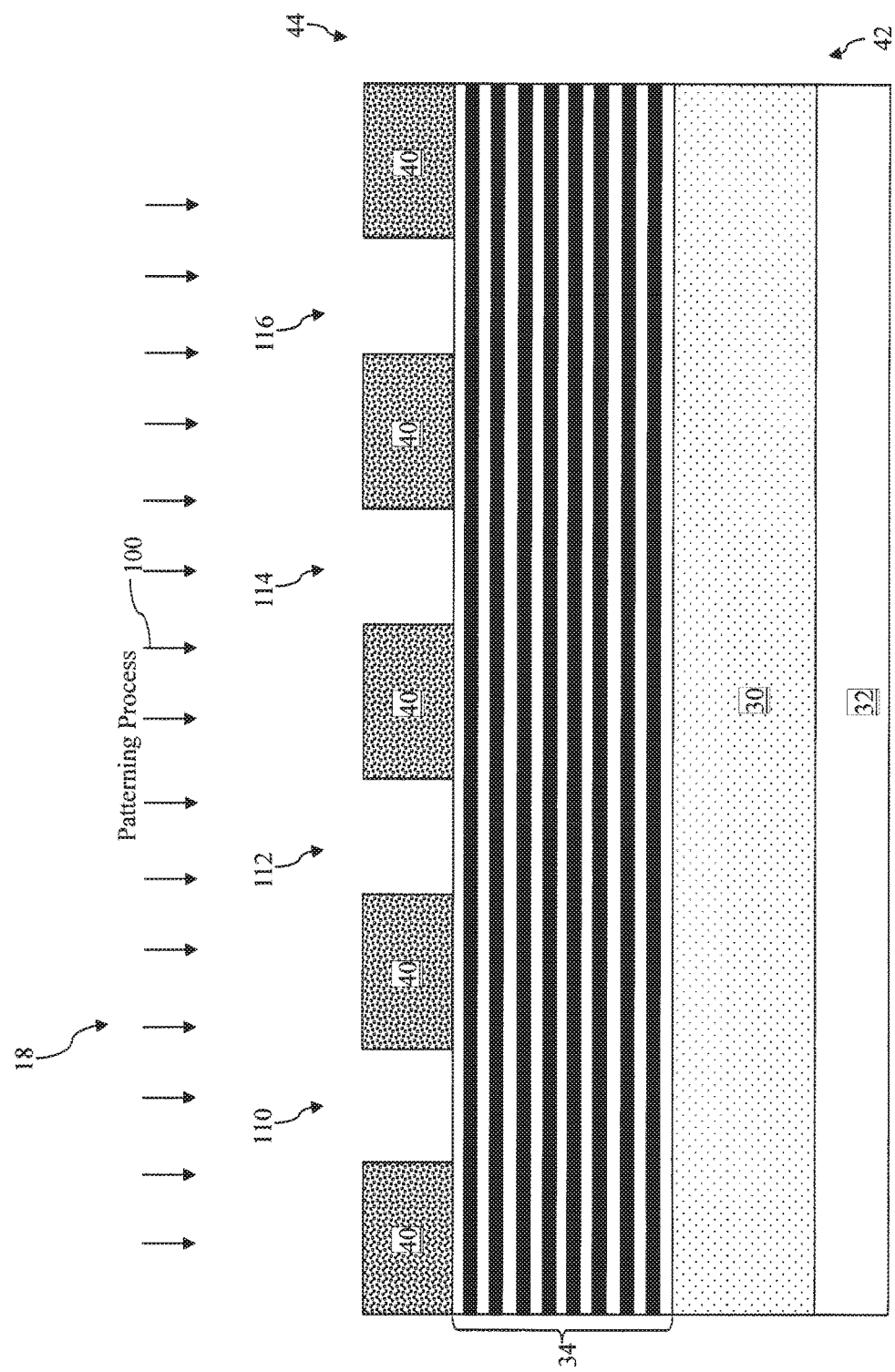

Referring now to FIG. 4, a patterning process 100 is performed to pattern the absorber layer 40. The patterning process 100 forms a plurality of trenches in the absorber layer 40, for example trenches 110, 112, 114, and 116. At least some of the trenches 110-116 may be used as transmission-type overlay marks for the EUV mask 18.

Figure 5:
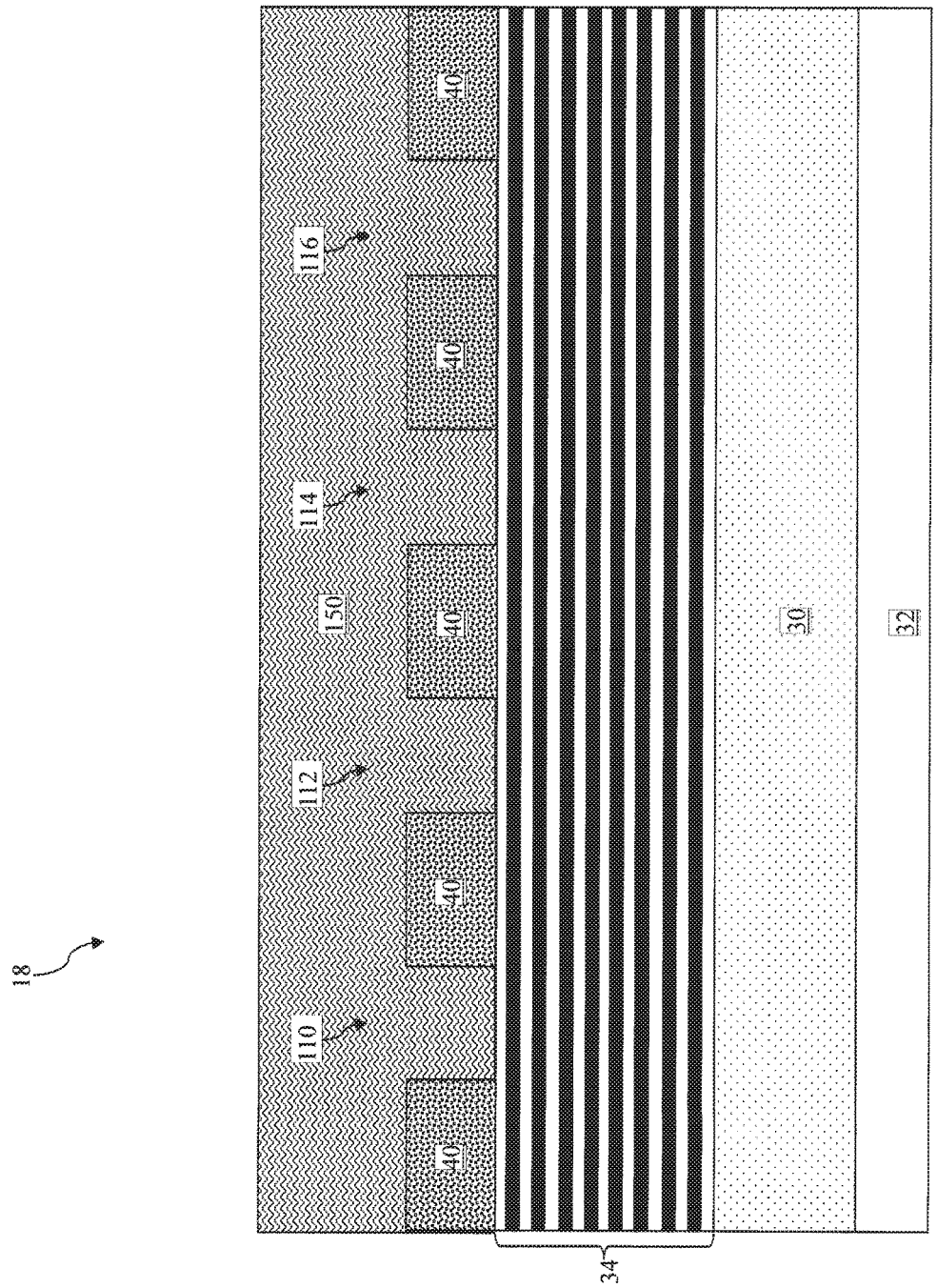

Referring now to FIG. 5, a photoresist layer 150 is formed over the patterned absorber layer 40. The photoresist layer 150 fills the trenches 110, 112, 114, and 116. In some embodiments, the photoresist layer 150 may be formed by a spin-coating process in some embodiments.

Figure 6:
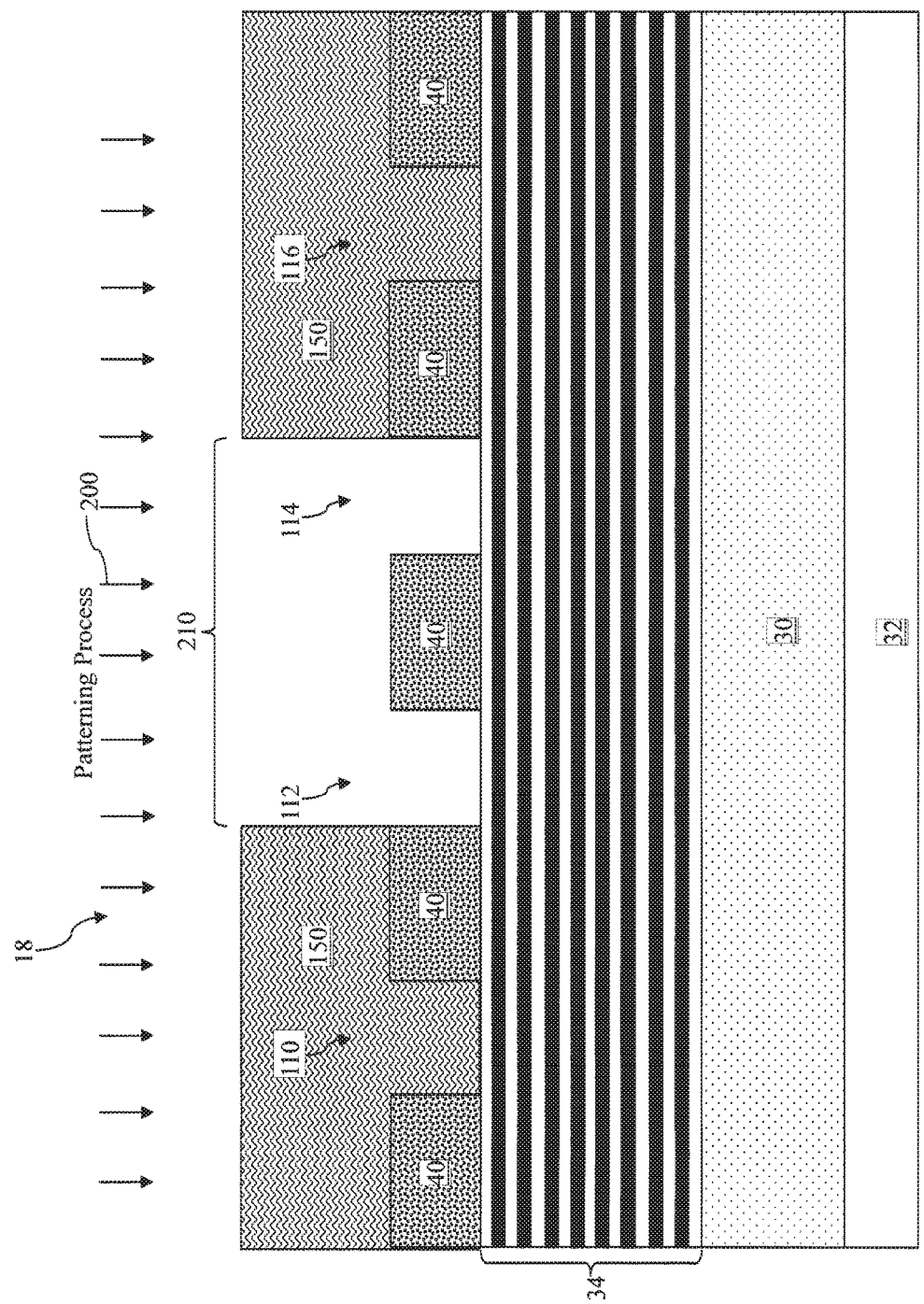

Referring now to FIG. 6, a patterning process 200 is performed to the EUV mask 18 from the side 44. The patterning process 200 includes forming an opening 210 in the photoresist layer 150 using one or more exposure, baking, developing, and rinsing processes (not necessarily performed in this order). In other words, a portion of the photoresist layer 150 corresponding to the opening 210 is removed. The opening 210 is formed to be wide (lateral dimension in FIG. 6) enough such that the trenches 112 and 114 are exposed by the opening 210, but narrow enough so that the trenches 110 and 116 are not exposed.

Figure 7:
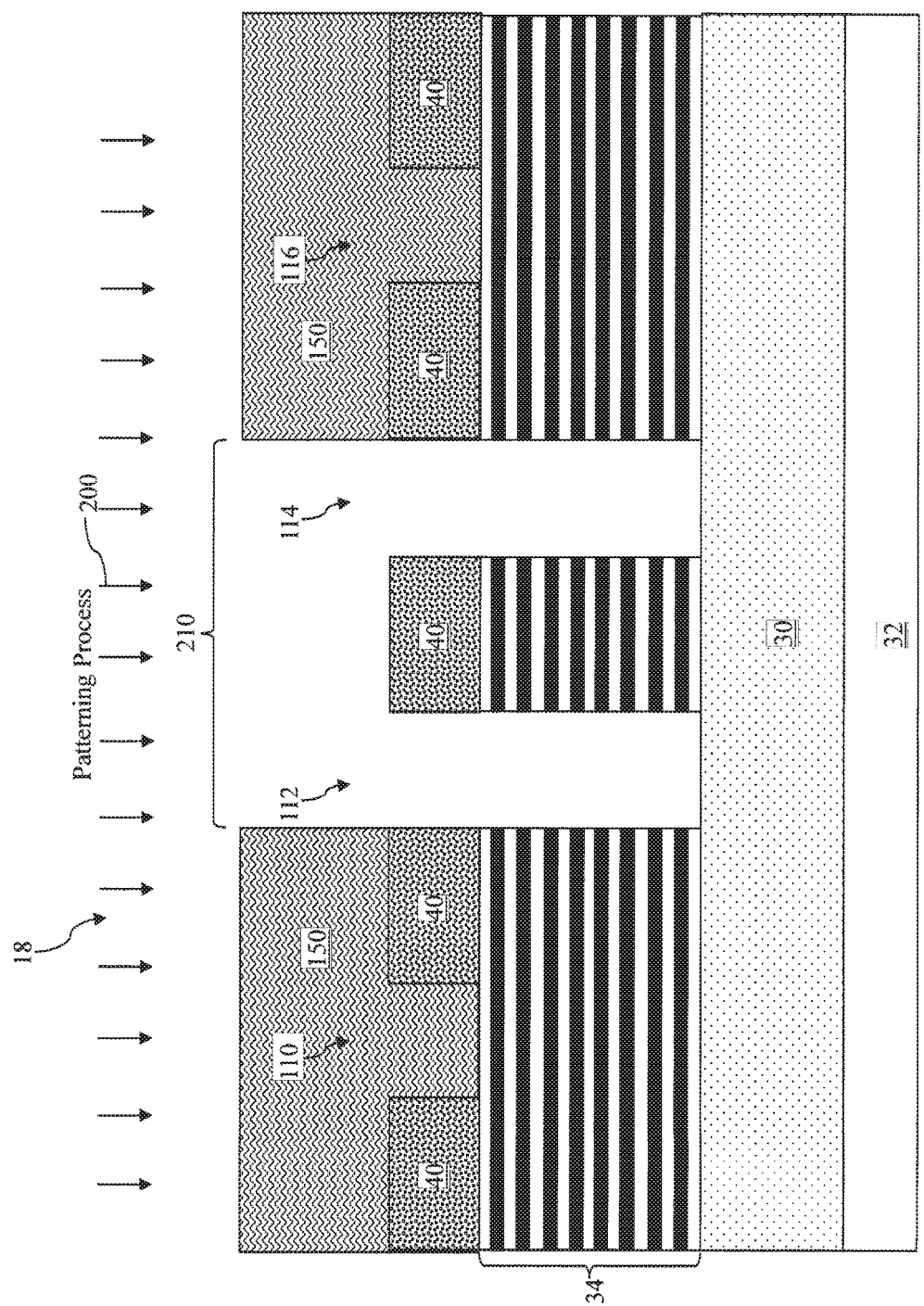

Referring now to FIG. 7, the patterning process 200 also involves performing one or more etching processes (e.g., dry etching processes) to extend some of the trenches (e.g., trenches 112 and 114) through the reflective ML structure 34 (but not through the LTEM substrate 30). During the etching processes, the remaining portions of the photoresist layer 150 serve as an etching mask to protect the layers therebelow from being etched. The portion of the absorber layer 40 exposed by the opening 210 may also serve as protection for portions of the reflective ML structure 34 disposed therebelow during the etching processes. In other words, the etching processes may be configured such that there is sufficient etching selectivity between the absorber layer 40 and the reflective structure 34. In this manner, the reflective ML structure 34 may be etched away while the exposed absorber layer 40 is substantially unaffected.

Figure 8:
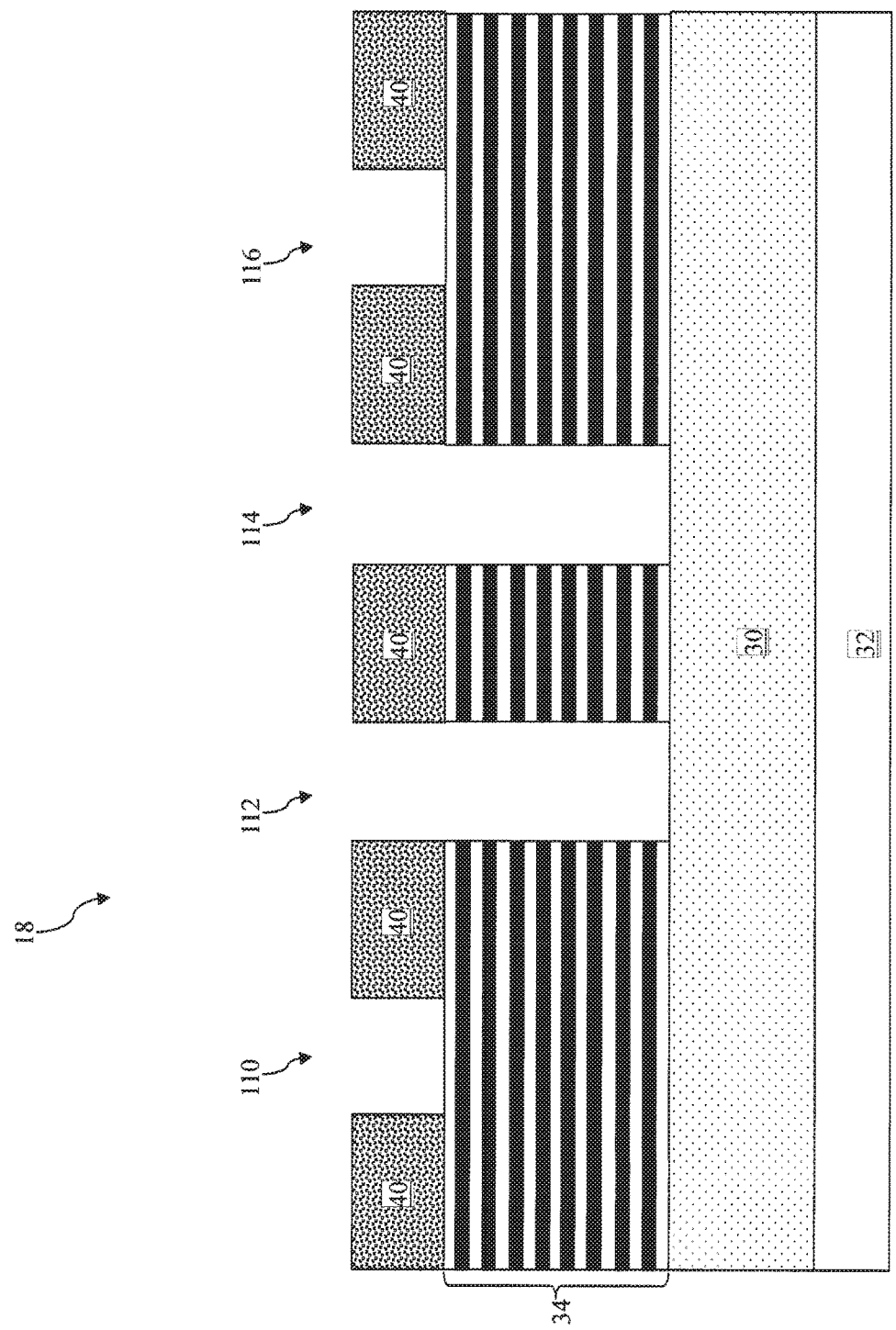

Referring now to FIG. 8, the photoresist layer 150 is removed, for example through a photoresist ashing process or a photoresist stripping process. The removal of the photoresist layer 150 exposes the trenches 110 and 116. The trenches 112 and 114 are already exposed in the previous process as shown in FIG. 6.

Figure 9:
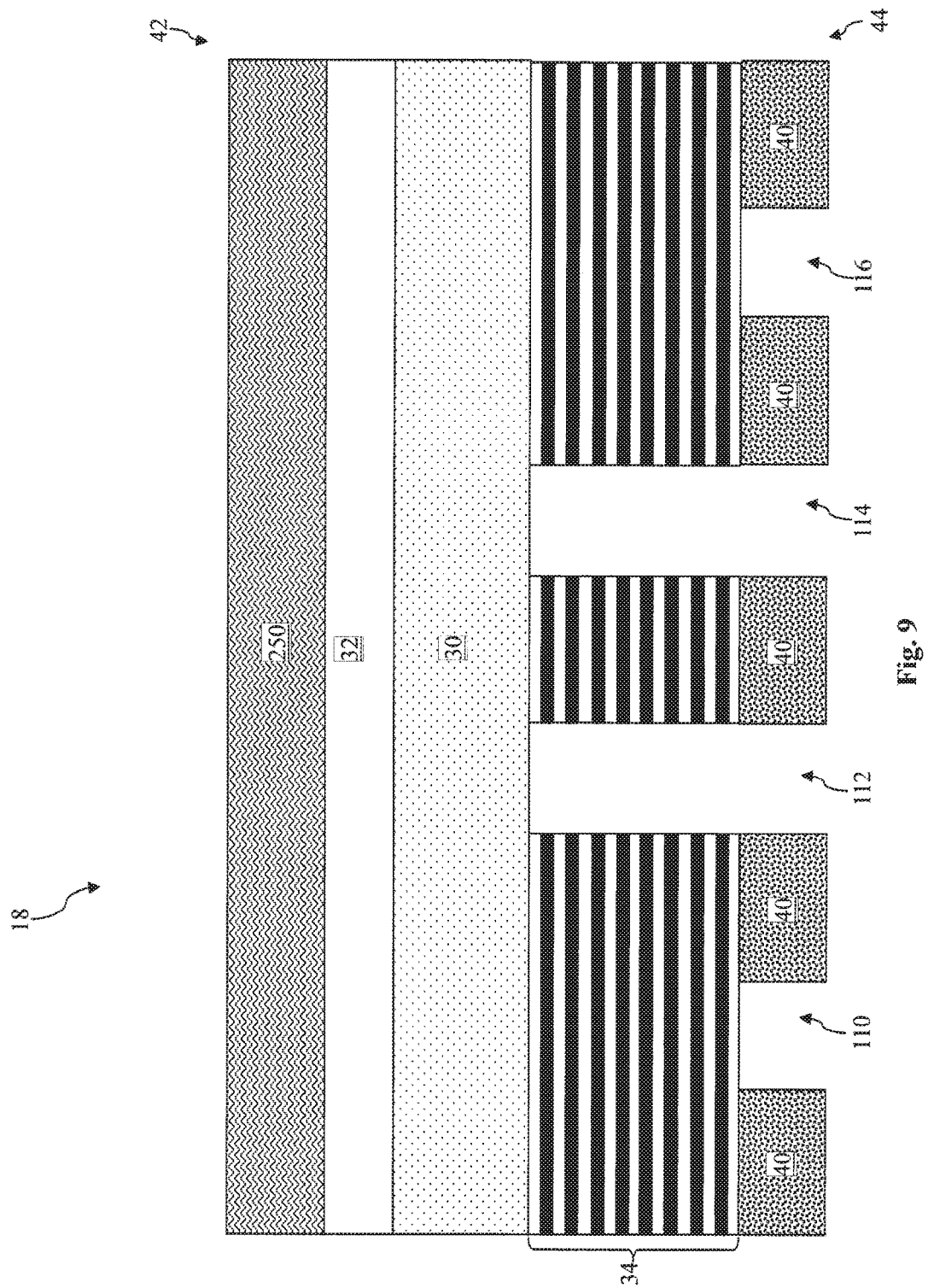

Referring now to FIG. 9, to facilitate the e suing discussions, the EUV mask 18 is "flipped upside down". A photoresist layer 250 is formed over the conductive layer 32 on the side 42. The photoresist layer 250 will be used to form trenches in the conductive layer 32, and these trenches will be used as reflective-type overlay marks of the EUV mask 18, as discussed below.

Figure 10:
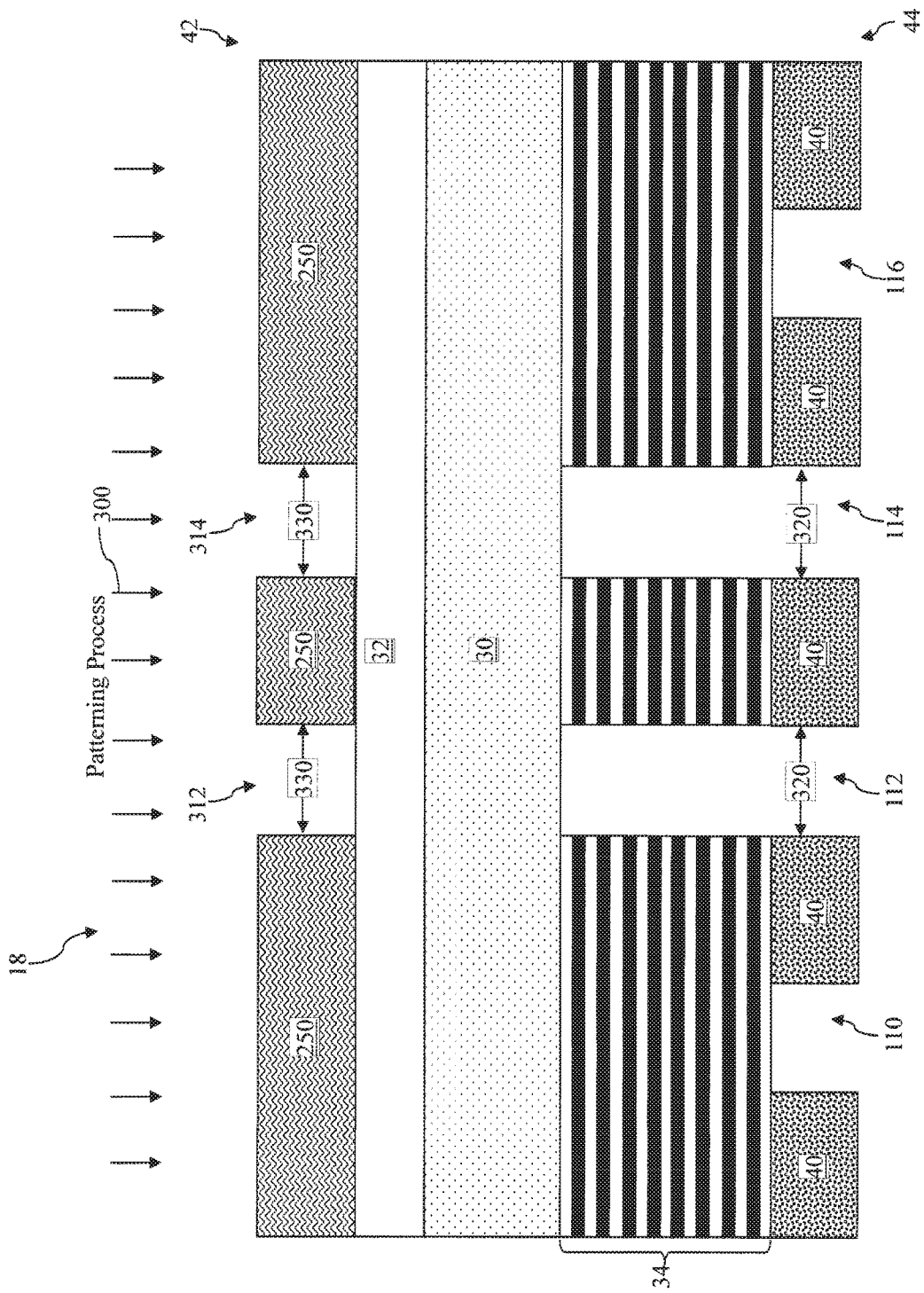

Referring now to FIG. 10, a patterning process 300 is performed to the EUV mask 18 from the side 42. The patterning process 300 includes forming trenches 312 and 314 in the photoresist layer 250 using one or more exposure, baking, developing, and rinsing processes necessarily performed in this order). In other words, portions of the photoresist layer 250 corresponding to the trenches 312-314 are removed. The trench 312 is formed to be aligned with the trench 112, and the trench 314 is formed to be aligned with the trench 114. The alignment of the trenches 112-312 and trenches 114-314 are in a "vertical" direction in FIG. 10. However, the width or lateral dimension of these vertically aligned trenches 112-312 and 114-314 need not be equal. For example, in some embodiments a lateral dimension 320 of the trenches 112 or 114 is greater than a lateral dimension 330 of the trenches 312 or 314. This is configured to facilitate the pass-through of an optical radiation for the transmission-type overlay mark.

Figure 11:
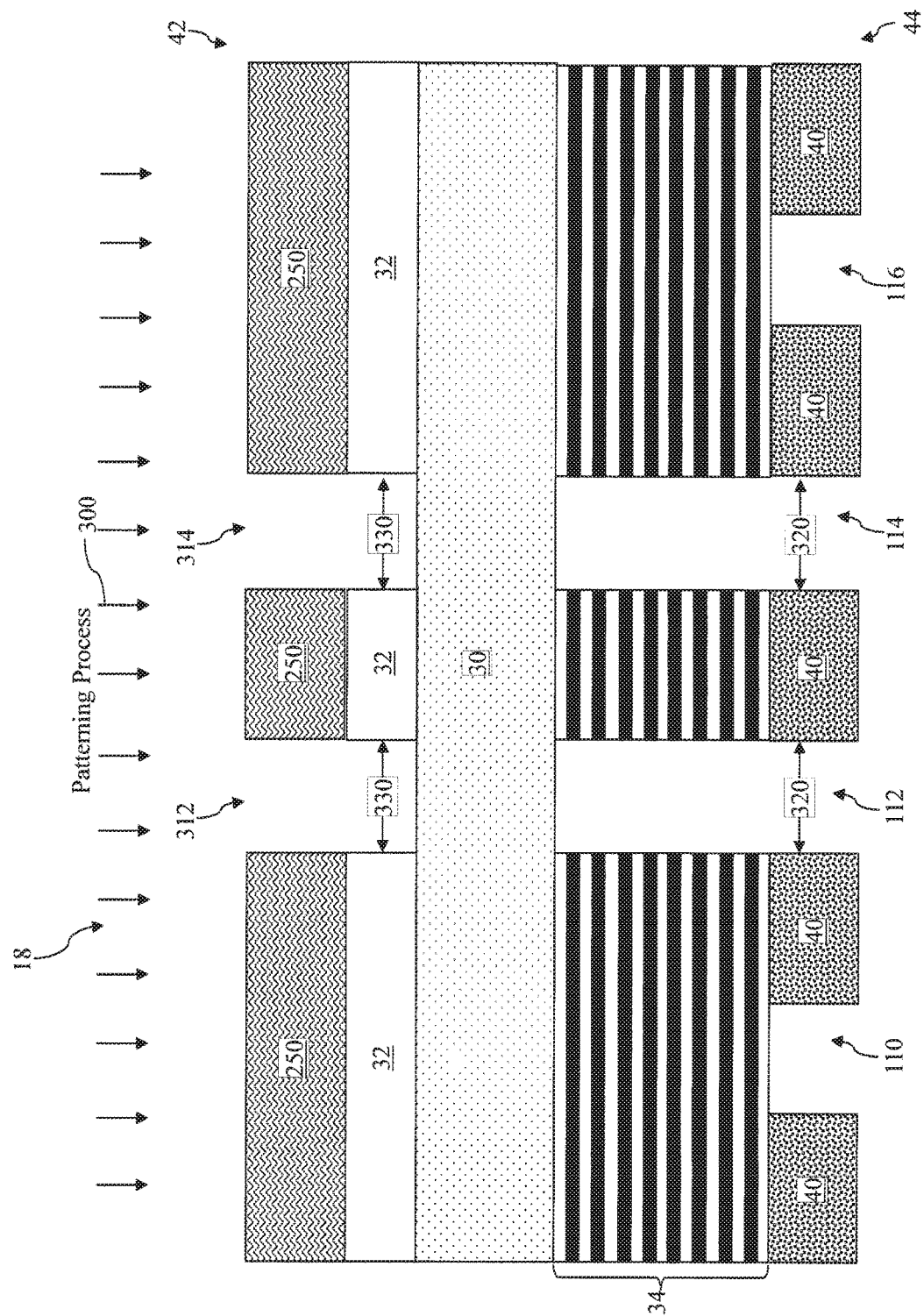

Referring now to FIG. 11, the patterning process 300 also involves performing one or more etching processes (e.g., dry etching processes) to extend the trenches 312 and 314 through the conductive layer 32 (but not through the LTEM substrate 30). During the etching processes, the remaining portions of the photoresist layer 250 serve as an etching mask to protect the layers therebelow from being etched.

Figure 12:
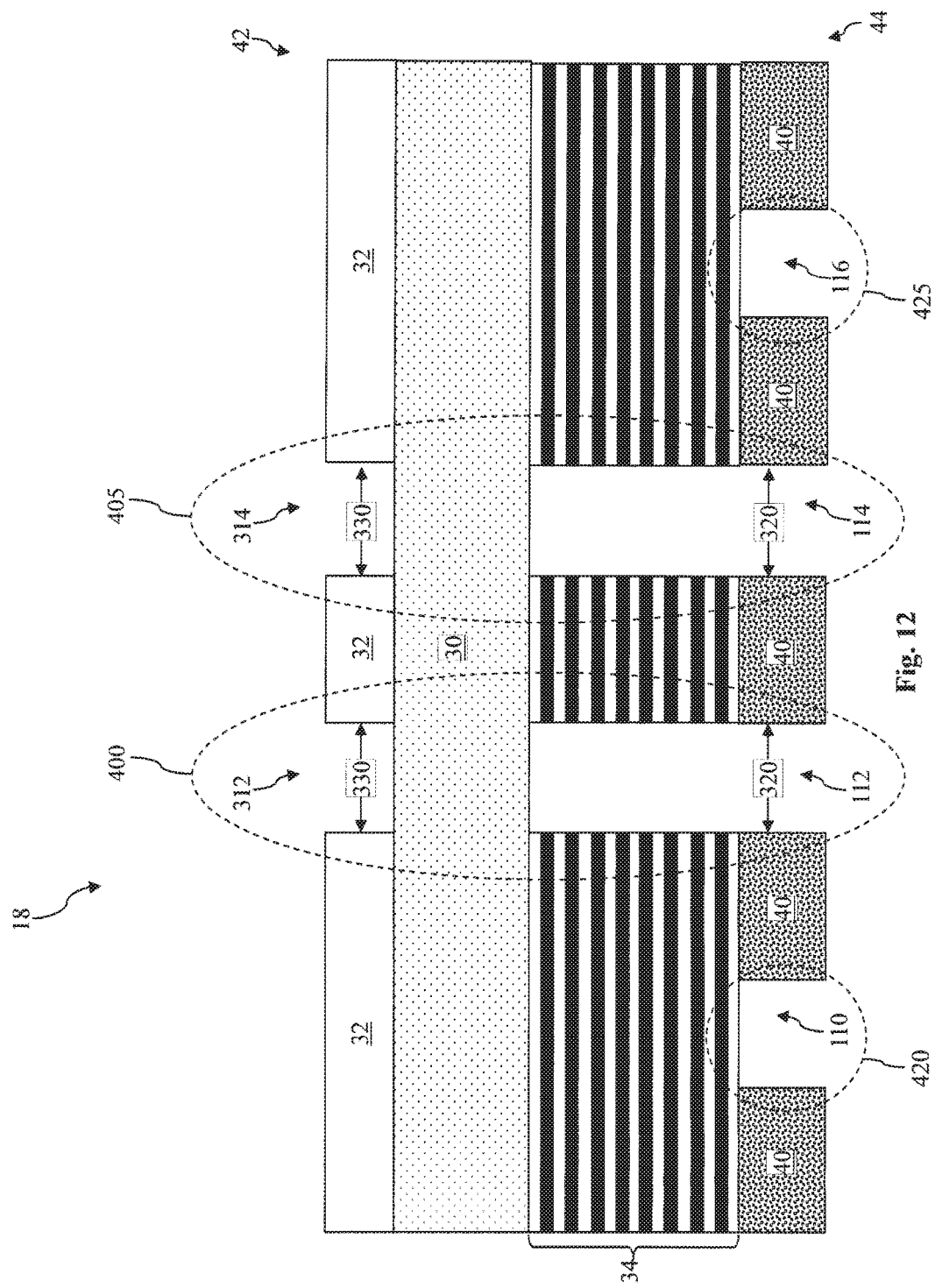

Referring now to FIG. 12, the photoresist layer 250 is removed, for example through a photoresist asking process or a photoresist stripping process. The removal of the photoresist layer 250 leaves the trenches 312 and 314 in the conductive layer 32. According to the embodiments of the present disclosure, the trenches 312-314 (along with the trenches 112 and 114) are parts of transmission-type overlay marks. For example, the trench 312 and the trench 314 collectively form a transmission-type overlay mark 400, and the 314 and the trench 114 collectively form another transmission-type overlay mark 405. The LTEM substrate 30 is substantially transparent and therefore does not impede the transmission of light in this case. As such, light can propagate from the trench 312 to the trench 112 (or vice versa) through the LTEM substrate 30, and likewise from the trench 314 to the trench 314 (over vice versa). As discussed above, the lateral dimension 320 of the trenches 112 or 114 is greater than a lateral dimension 330 of the trenches 312 or 314 in some embodiments, so as to minimize the obstruction of light.

The transmission-type overlay marks 400 and 405 are suitable for use in non-EUV lithography processes, for example in an optical lithography process using a 193-nm light source. As such, the EMI mask 18 is capable of being used as a lithography mask in non-EUV lithography processes. Meanwhile, the trenches 110 and 116 formed on the side 44 in the absorber layer 40 form reflective-type overlay marks 420 and 425, respectively. The reflective-type overlay marks are suitable for being used in EUV lithography processes. In this manner, both transmission-type overlay marks 400-405 and reflective-type overlay marks 420-425 may be formed on the same EUV mask 18, just on different sides (e.g., sides 42 and 44) of the EUV mask. As such, the same EUV mask 18 may be used to perform both non-EUV lithography processes as well as EUV lithography processes.

It is understood that when the EUV mask 18 is being used to perform non-EUV lithography processes, it can be secured by clamps that do not obstruct the optical path of the radiation propagating through the trenches 112-312 or 114-314. When the EUV mask 18 is being used to perform EUV lithography processes, it can be secured to the mask stage 16 (e.g., an e-chuck that secures the EUV mask 18 via physical contact with the conductive layer 32) of FIG. 1. To ensure that the EUV mask 18 can be sufficiently secured to the mask stage 16 in EUV lithography processes, the lateral dimensions 330 of the trenches 312 and 314 are configured to not exceed predetermined thresholds. For example, a predetermined threshold may be 5 microns in some embodiments, or 10 microns in other embodiments, or 100 microns in yet other embodiments. In various embodiments, the predetermined threshold may be in a range from 5 microns to 100 microns.

Figure 13:
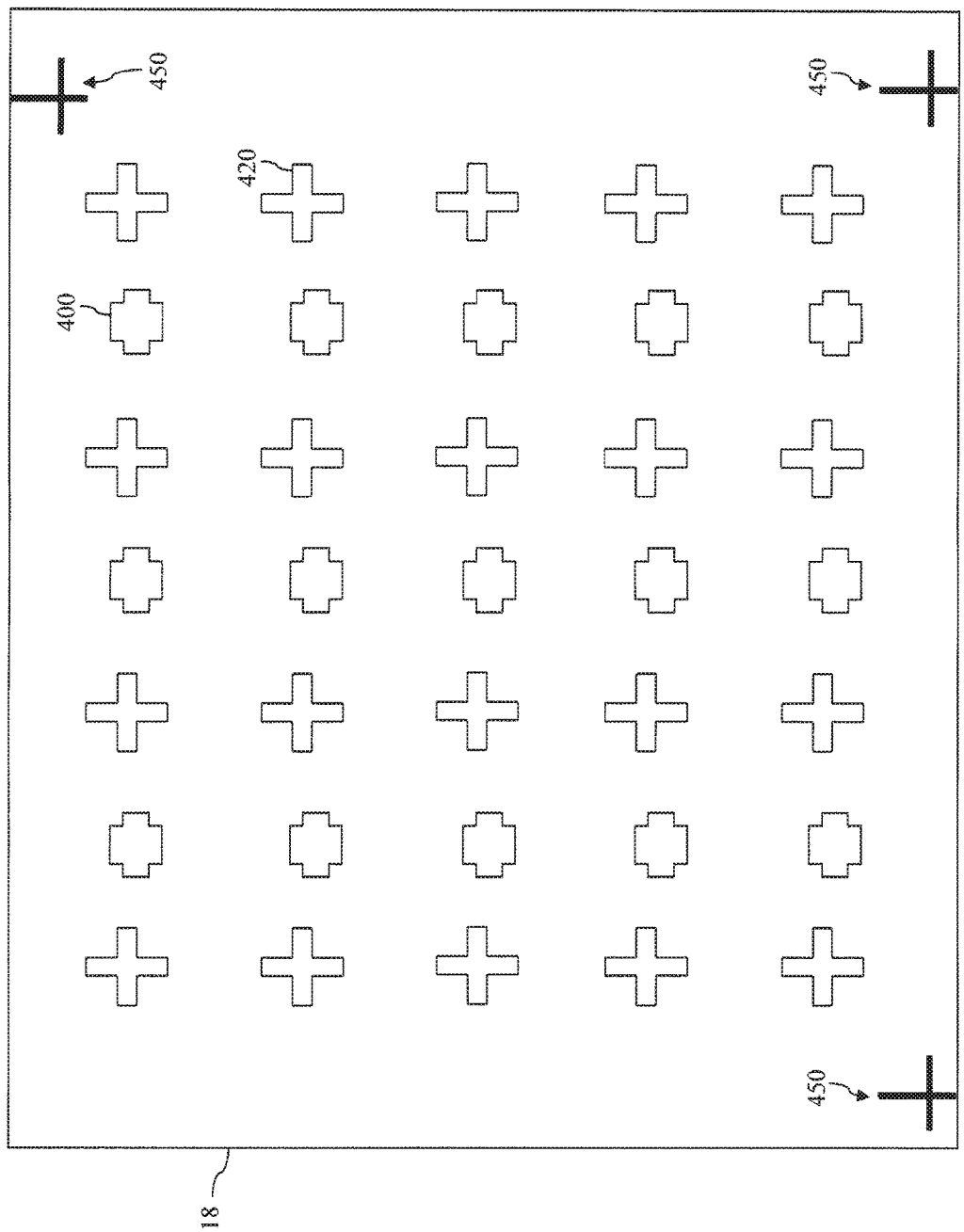
FIG. 13 illustrates a planar view of a lithography mask according to embodiments of the present disclosure.

Referring now to FIG. 13, a diagrammatic fragmentary planar view (e.g., a top view obtained by looking at the EUV mask 18 from the side 44) of the EUV mask 18 is illustrated. The EUV mask 18 contains fiducial marks 450, which help provide or establish a reference points or positions for alignment. In addition, example overlay marks, both transmission-type (e.g., overlay mark 400) and reflective-type (e.g., overlay mark 420), are illustrated in FIG. 13. As discussed above, the presence of both transmission-type overlay marks and reflective-type overlay marks on the same lithography mask 18 allows the mask 18 to be used in both non-EUV lithography as well as EUV lithography. Thus, the implementation of these "dual registration marks" (both transmission-type and reflective type marks) on the same mask enhances the versatility of the mask 18 and simplifies fabrication processing, since one mask may be used to perform both non-EUV and EUV lithography processes. In addition, it is now possible to directly check e-beam drawing displacement and/or scanner overlay errors independently.

Figure 14:
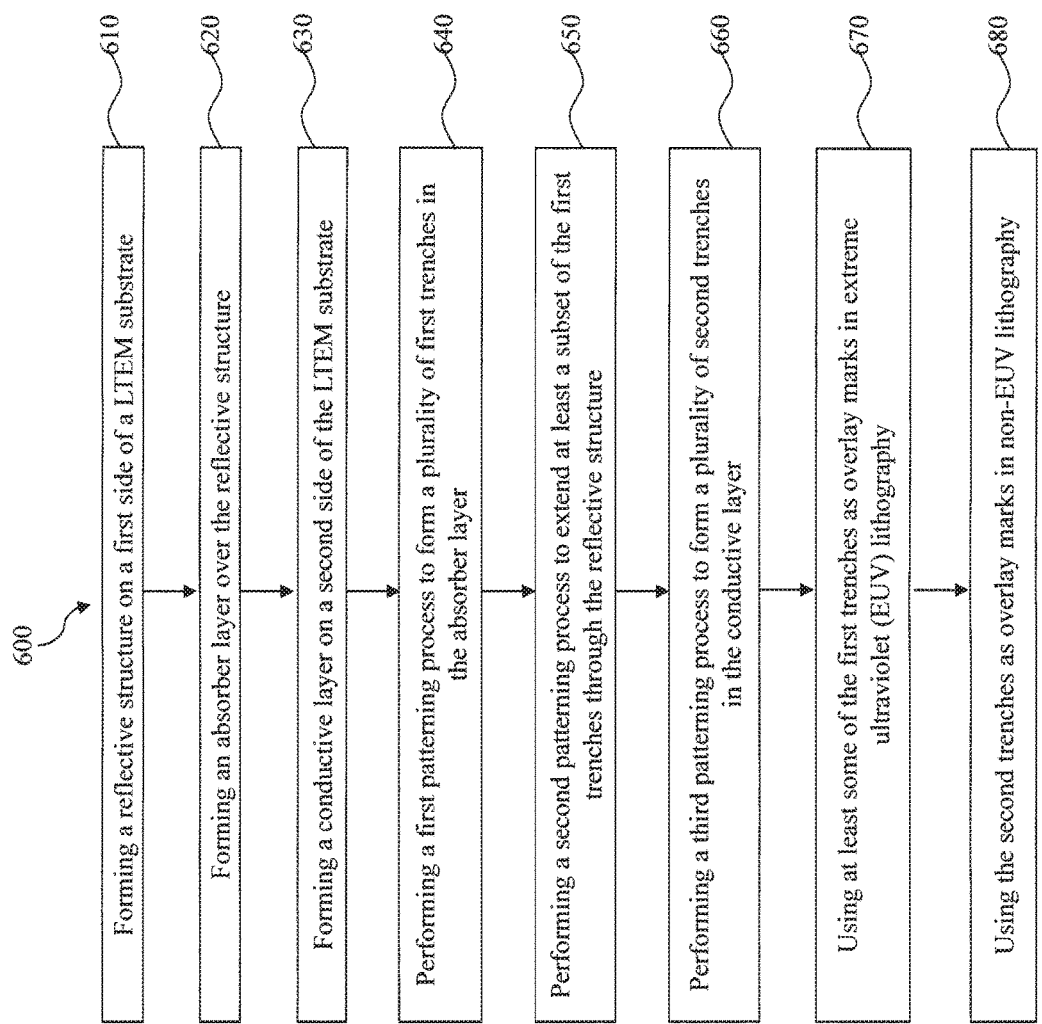
FIG. 14 is a flowchart illustrating a method of fabricating a lithography mask in accordance with some embodiments of the present disclosure.

FIG. 14 is a flowchart of a method 600 of performing a semiconductor fabrication process according to various aspects of the present disclosure.

The method 600 includes a step 610 of forming a reflective structure over a first side of a LTEM substrate. In some embodiments, the reflective structure includes a multilayer structure that is configured to provide a high reflectivity for a predefined radiation wavelength, for example a reflectivity above a predetermined threshold.

The method 600 includes a step 620 of forming an absorber layer over the reflective structure.

The method 600 includes a step 630 of forming a conductive layer on a second side of the LTEM substrate. The second side is opposite the first side. In some embodiments, the conductive layer contains chromium nitride or a tantalum-containing material.

The method 600 includes a step 640 of performing a first patterning process to form a plurality of trenches in the absorber layer.

The method 600 includes a step 650 of performing a second patterning process to extend at least a subset of the first trenches through the reflective structure.

The method 600 includes a step 660 of performing a third patterning process to form a plurality of second trenches in the conductive layer. In some embodiments, the third patterning process is performed such that each of the second trenches is aligned with a respective one of the first trenches in the subset. In some embodiments, the third patterning process is performed such that the second trenches are each formed to have a greater lateral dimension than the respective first trench aligned therewith.

The method 600 includes a step 670 of using at least some of the first trenches as overlay marks in EUV lithography to measure overlay. In some embodiments, the at least some of the first trenches are used as reflective type overlay marks.

The method 600 includes a step 680 of using the second trenches as overlay marks in non-EUV lithography to measure overlay. In some embodiments, the second trenches are used as transmission type overlay marks.

It is understood that additional processes may be performed before, during, or after the steps 610-680 of the method 600 to complete the fabrication of the semiconductor device. For reasons of simplicity, these additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage is that the methods of the present disclosure allows the formation of both transmission-type overlay marks and reflective-type overlay marks on the same lithography mask, for example an EUV lithography mask. As such, the lithography mask can be used to perform both non-EUV lithography processes (e.g., an optical lithography using a 193-nm light source) and EUV lithography processes, where the transmission-type overlay marks are used in non-EUV lithography processes, and reflective-type overlay marks are used in EUV lithography processes. By doing so, the present disclosure achieves versatility, simplicity, and flexibility in semiconductor fabrication processing. In addition, the presence of both types of overlay marks on the same lithography mask means it is no longer necessary to align a non-EUV lithography mask (containing transmission-type overlay marks) with a separate EUV lithography mask (containing reflective-type overlay marks). This greatly reduces potential alignment or overlay errors in semiconductor fabrication, and thus semiconductor device performance may improve. Furthermore, the processes discussed herein are easy to implement and need no special tools or processing, and thus the present disclosure is inexpensive to implement and does not lead to substantially increased fabrication costs.

Figure 15:
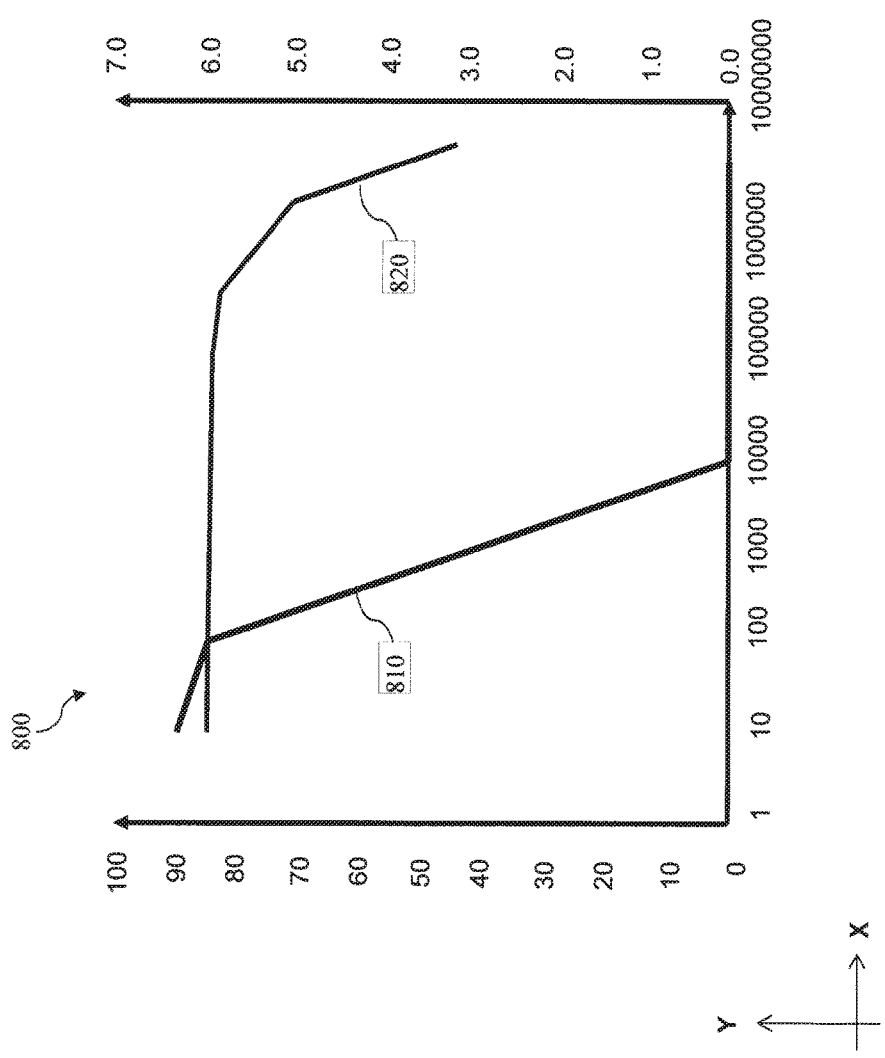
FIG. 15 is a graph illustrating a relationship between dopant concentrations in Quartz glass and transmittance and thermal expansion coefficient in accordance with some embodiments of the present disclosure.

Referring now to FIG. 15, a graph 800 is provided that illustrates a relationship between dopant concentrations in Quartz glass and transmittance and thermal expansion coefficient according to an embodiment of the EUV mask of the present disclosure. In more detail, an X axis of the graph 800 represents the dopant concentration in Quartz glass, by units of parts-per-billion (ppb) in a logarithmic scale. The Y-axis on the left of the graph 800 represents the transmittance % for deep ultraviolet (DUV) radiation, varying from 0%-100%, The Y-axis on the right of the graph 800 represents the thermal expansion coefficient (with units of $/10^{-7}$ $K^{-1}$).

The graph 800 includes a plot 810 and a plot 820. The plot 810 illustrates the relationship between the dopant concentration in Quartz glass and the DUV transmission rate. The plot 820 illustrates the relationship between the dopant concentration in Quartz glass and the thermal expansion coefficient. As the plot 810 shows, the DIN transmission rate starts off high (near 90%), but dips as the dopant concentration increases. After the dopant concentration goes above 10,000 ppb, the DUV transmission rate drops down to close to (or at) zero. As the plots 820 shows, the thermal expansion coefficient starts off relatively high (near $6.0/10^{-7}$ $K^-$) and remains nearly constant for a while, until the dopant concentration reaches around 1,000,000 ppb, after which the thermal expansion coefficient begins to drop. After the dopant concentration reaches about 10,000,000, the thermal expansion coefficient drops even more quickly.

One aspect of the present disclosure pertains to a lithography mask. The lithography mask includes a substrate that contains a low thermal expansion material (LTEM). A reflective structure is disposed over a first side of the substrate. An absorber layer is disposed over the reflective structure. The absorber layer contains one or more first overlay marks. A conductive layer is disposed over a second side of the substrate, the second side being opposite the first side. The conductive layer contains portions of one or more second overlay marks.

Another aspect of the present disclosure pertains to a method of fabricating a lithography mask. A first patterning process is performed to form a plurality of first trenches in an absorber layer, the absorber layer being disposed over a reflective structure, the reflective structure being disposed over a first side of a substrate that contains a low thermal expansion material (LTEM). A second patterning process is performed to extend at least a subset of the first trenches through the reflective structure. A third patterning process is performed to form a plurality of second trenches in a conductive layer, the conductive layer being disposed over a second side of the substrate that is opposite the first side.

Yet another aspect of the present disclosure pertains to a system of performing a lithography process. A lithography mask is received. The lithography mask includes: a substrate that contains a low thermal expansion material (LTEM); a reflective structure disposed over a first side of the substrate; an absorber layer disposed over the reflective structure, wherein the absorber layer contains one or more first overlay marks; and a conductive layer disposed over a second side of the substrate, the second side being opposite the first side, wherein the conductive layer contains one or more second overlay marks. An extreme ultraviolet (EUV) lithography process is performed. The first overlay marks is used to measure overlay in the EUV process. A non-EUV lithography process is performed. The second overlay marks is used to measure overlay in the non-EUV process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography mask, comprising:
   a substrate that contains a low thermal expansion material (LTEM), the LTEM material having a thermal coefficient of expansion that is equal to or less than $TiO_2$ doped $SiO_2$;
   a reflective structure disposed over a first side of the substrate;
   an absorber layer disposed over the reflective structure, wherein the absorber layer contains one or more first overlay marks; and
   a conductive layer disposed over a second side of the substrate, the second side being opposite the first side, wherein the conductive layer includes portions of one or more second overlay marks;
   wherein the first overlay marks are reflective-type marks, and the second overlay marks are transmission-type marks.

2. The lithography mask of claim 1, wherein:
   the one or more first overlay marks include one or more first trenches; and
   the portions of the one or more second overlay marks include one or more second trenches.

3. The lithography mask of claim 2, wherein the one or more second overlay marks include third trenches that extend through the reflective structure and through the absorber layer.

4. The lithography mask of claim 3, wherein each of the second trenches is aligned with a respective one of the third trenches.

5. The lithography mask of claim 4, wherein the second trenches have a lateral dimension different than the respective third trenches aligned therewith.

6. The lithography mask of claim 2, wherein the reflective structure is configured to provide a reflectivity for a predefined radiation wavelength, the reflectivity being above a predetermined threshold that is in a range from 5 microns to 100 microns.

7. The lithography mask of claim 1, wherein the conductive layer contains chromium nitride or a tantalum-containing material.

8. The lithography mask of claim 1, wherein:
   the one or more first overlay marks are configured to be used as overlay marks in extreme ultraviolet (EUV) lithography; and
   the one or more second overlay marks are configured to be used as overlay marks in non-EUV lithography.

9. A method of fabricating a lithography mask, comprising:
   performing a first patterning process to form a plurality of first trenches in an absorber layer, the absorber layer being disposed over a reflective structure, the reflective structure being disposed over a first side of a substrate that contains a low thermal expansion material (LTEM);
   performing a second patterning process to extend at least a subset of the first trenches through the reflective structure; and
   performing a third patterning process to form a plurality of second trenches in a conductive layer, the conductive layer being disposed over a second side of the substrate that is opposite to the first side;
   wherein the third patterning process is performed such that each of the second trenches is aligned with a respective one of the first trenches in the subset.

10. The method of claim 9, wherein the third patterning process is performed such that the second trenches have a different lateral dimension than the corresponding first trenches aligned therewith.

11. The method of claim 9, further comprising: using at least some of the first trenches as overlay marks in extreme ultraviolet (EUV) lithography.

12. The method of claim 11, wherein the using of at least some of the first trenches as overlay marks comprises using the at least some of the first trenches as reflective-type overlay marks.

13. The method of claim 9, further comprising: using the second trenches as overlay marks in non-EUV lithography.

14. The method of claim 13, wherein the using of the second trenches as overlay marks comprises using the second trenches as transmission-type overlay marks.

15. The method of claim 9, further comprising, before the first patterning process is performed:
   forming the reflective structure on the first side of the substrate, the reflective structure being configured to provide a reflectivity for a predefined radiation wavelength, the reflectivity being above a predetermined threshold; and
   forming the conductive layer on the second side of the substrate, the conductive layer containing chromium nitride or a tantalum-containing material.

16. A lithography mask, comprising:
   a substrate that contains a low thermal expansion material (LTEM),
   a reflective structure disposed over a first side of the substrate;
   an absorber layer disposed over the reflective structure, wherein the absorber layer has one or more first trenches; and
   a conductive layer disposed over a second side of the substrate, the second side being opposite the first side, wherein the conductive layer includes one or more second trenches;
   wherein each of a subset of the first trenches is aligned with a respective one of the second trenches.

17. The lithography mask of claim 16, wherein the reflective structure includes one or more third trenches.

18. The lithography mask of claim 17, wherein the one or more second trenches and the one or more third trenches are aligned along a direction perpendicular to the first side of the substrate.

19. The lithography mask of claim 16, wherein at least some of the first trenches are configured to be used as overlay marks in extreme ultraviolet (EUV) lithography.

20. The lithography mask of claim 16, wherein the second trenches have a lateral dimension different than the respective first trenches aligned therewith.

* * * * *